(12) United States Patent
Amin-Shahidi et al.

(10) Patent No.: US 10,718,354 B2
(45) Date of Patent: Jul. 21, 2020

(54) FLEXURE BACK-FLOW STOPPER

(71) Applicant: Western Digital Technologies, Inc., San Jose, CA (US)

(72) Inventors: Darya Amin-Shahidi, San Jose, CA (US); Michael Stephen Bell, Colorado Springs, CO (US); Toshiki Hirano, San Jose, CA (US); Neale Marvin Jones, Morgan Hill, CA (US); Jeffrey David Wilke, Palmer Lake, CO (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/928,603

(22) Filed: Mar. 22, 2018

(65) Prior Publication Data

US 2018/0209446 A1    Jul. 26, 2018

Related U.S. Application Data

(63) Continuation of application No. 14/707,605, filed on May 8, 2015, now Pat. No. 9,938,990.

(51) Int. Cl.
| | |
|---|---|
| *H05K 5/00* | (2006.01) |
| *F04D 29/64* | (2006.01) |
| *H05K 7/20* | (2006.01) |
| *F04D 29/54* | (2006.01) |
| *F04D 25/14* | (2006.01) |

(52) U.S. Cl.
CPC .......... *F04D 29/646* (2013.01); *F04D 25/14* (2013.01); *F04D 29/541* (2013.01); *H05K 7/20172* (2013.01); *H05K 7/20181* (2013.01); *H05K 7/20736* (2013.01)

(58) Field of Classification Search
CPC ..... F04D 25/14; F04D 29/664; H05K 7/2019; H05K 7/20172; H05K 7/20181; H05K 7/201736
USPC ............... 454/184, 127, 259, 353, 358, 359; 361/695; 415/127
See application file for complete search history.

(56) References Cited

U.S. PATENT DOCUMENTS

| | | | |
|---|---|---|---|
| 5,890,959 A * | 4/1999 | Pettit | .................... H05K 7/2019 137/849 |
| 6,031,717 A | 2/2000 | Baddour et al. | |
| 6,181,557 B1 | 1/2001 | Gatti | |
| 6,688,965 B1 | 2/2004 | Crippen et al. | |
| 7,302,967 B2 * | 12/2007 | Maeda | .................... F04D 25/14 137/512.1 |

(Continued)

*Primary Examiner* — Vivek K Shirsat

(57) ABSTRACT

A compact back-flow stopper using an elastic flexure mechanism for a cooling fan is shown and described. The backflow stopper assembly comprises a frame configured to structurally support a fin array when coupled to a fan. The fin array comprises a plurality of flexural deformation elements and associated fin elements arrayed in a radial arrangement to establish a pathway for airflow, each of the flexural deformation elements configured to move an attached fin element responsive to airflow impacting the attached fin element. Flex limiter elements are coupled to the frame and configured to limit flexure of the fin elements beyond a predetermined flexure in relation to the frame to stop backflow of air through the fin array. A fan assembly with a backflow stopper is shown and described. Also, a data storage assembly using fan assemblies with backflow stoppers is also shown and described.

21 Claims, 7 Drawing Sheets

(56) References Cited

U.S. PATENT DOCUMENTS

| | | |
|---|---|---|
| 7,535,709 B2 | 5/2009 | Fan |
| 7,719,836 B2 | 5/2010 | Franz et al. |
| 7,800,902 B2 | 9/2010 | Della Fiora et al. |
| 8,007,228 B2 | 8/2011 | Wang |
| 8,366,417 B2 | 2/2013 | Fan |
| 8,668,435 B2 * | 3/2014 | Weisser .............. F04D 25/0613 415/146 |
| 9,938,990 B2 * | 4/2018 | Amin-Shahidi ...... F04D 29/646 |
| 2005/0088818 A1 | 4/2005 | Chou |
| 2006/0016482 A1 | 1/2006 | Berens et al. |
| 2007/0207720 A1 * | 9/2007 | Henry .................. H05K 7/1445 454/184 |
| 2009/0215380 A1 | 8/2009 | Lin |
| 2011/0175007 A1 | 7/2011 | Sato et al. |
| 2012/0145257 A1 | 6/2012 | Li |
| 2013/0044430 A1 | 2/2013 | Carl et al. |
| 2013/0056090 A1 | 3/2013 | Tang |
| 2013/0072103 A1 | 3/2013 | Hopkins |
| 2013/0324025 A1 * | 12/2013 | Peng ........................ G06F 1/20 454/184 |

\* cited by examiner

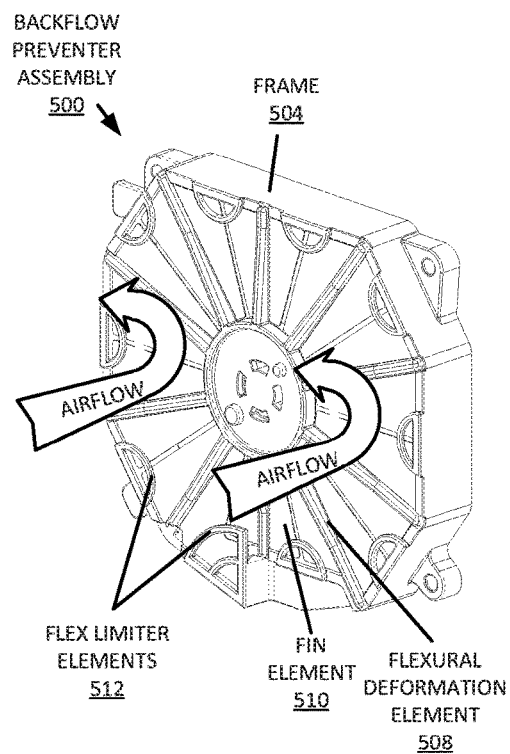
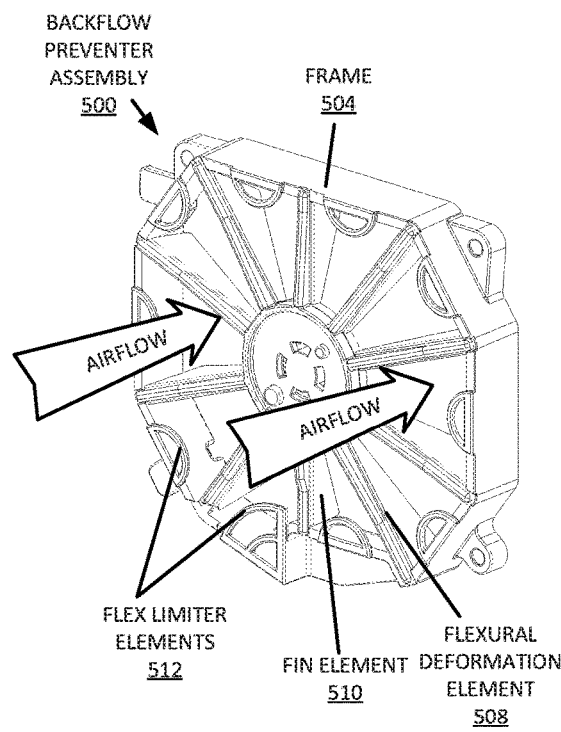
FIGURE 6A
FIGURE 6B

FLEXURE BACK-FLOW STOPPER

RELATED APPLICATIONS

This application is a continuation of, and claims priority to, U.S. patent application Ser. No. 14/707,605, filed on May 8, 2015, and entitled "Flexure Back-Flow Stopper," which is hereby incorporated by reference in its entirety.

TECHNICAL BACKGROUND

As networked computer systems grow in numbers and capability, there is a need for more storage system capacity. Cloud computing and large-scale data processing further increase the need for digital data storage systems that are capable of transferring and holding immense amounts of data. Data centers typically include many rack-mountable storage units which are used to store the large amounts of data.

One approach to providing sufficient data storage in data centers is the use of arrays of independent data storage devices. Many data storage devices can be held in an electronics enclosure. An electronics enclosure is a modular unit that can hold and operate independent data storage devices in an array, computer processors, routers and other electronic equipment. The data storage devices are held and operated in close proximity within the electronics enclosure, so that many data storage devices can be fit into a defined volume. Operating many data storage devices within close proximity within the electronics enclosure can create heat issues and lead to premature failure of the data storage devices.

Electronics enclosures typically include fans or other cooling devices. If a fan fails in an electronics enclosure having two or more fans, the failed fan becomes the pathway of least resistance for airflow and diverts cooling airflow away from the data storage devices. Some electronics enclosures include assemblies with hinged louvers that attach to the exhaust-side of the fan. When a fan fails, the louvers close under the force gravity or an active servo mechanism and prevent backflow through the failing fan. These louver assemblies are typically mounted external to the data storage assemblies or electronics enclosures to maximize usage of interior space for electronics components. Externally mounted backflow louvers add bulk to the enclosure and can interfere with cables, power cords, and walls near to the enclosure. Furthermore, louvered designs include many moving parts which can lead to reduced reliability of electronics enclosures.

OVERVIEW

A compact back-flow stopper using an elastic flexure mechanism for a cooling fan is shown and described. The backflow stopper assembly comprises a frame configured to structurally support a fin array when coupled to a fan. The fin array comprises a plurality of flexural deformation elements and associated fin elements arrayed in a radial arrangement to establish a pathway for airflow; each of the flexural deformation elements is configured to move an attached fin element responsive to airflow impacting the attached fin element. Flex limiter elements are coupled to the frame and configured to limit flexure of the fin elements beyond a predetermined flexure in relation to the frame to stop backflow of air through the fin array.

A fan assembly with a backflow stopper is shown and described. The fan assembly with a backflow stopper comprises a backflow stopper assembly coupled to a fan. The backflow stopper assembly comprises a frame configured to structurally support a fin array when coupled to the fan. The fin array comprises a plurality of flexural deformation elements and associated fin elements arrayed in a radial arrangement to establish a pathway for airflow, each of the flexural deformation elements configured to move an attached fin element responsive to airflow impacting the attached fin element. One or more flex limiter elements are coupled to the frame and configured to limit flexure of the fin elements beyond a predetermined flexure in relation to the frame to stop backflow of air through the fin array.

An electronics enclosure assembly is shown and described. The electronics enclosure assembly comprises an enclosure configured to support multiple electronic devices and one or more fan assemblies with backflow stoppers. Each fan assembly with a backflow stopper comprises a backflow stopper assembly coupled to a fan. The backflow stopper assembly comprising a frame configured to structurally support a fin array when coupled to the fan. The fin array comprising a plurality of flexural deformation elements and associated fin elements arrayed in a radial arrangement to establish a pathway for airflow, each of the flexural deformation elements configured to move an attached fin element responsive to airflow impacting the attached fin element. One or more flex limiter elements are coupled to the frame and configured to limit flexure of the fin elements beyond a predetermined flexure in relation to the frame to stop backflow of air through the fin array.

BRIEF DESCRIPTION OF THE DRAWINGS

FIG. 6A illustrates a backflow preventer assembly in a closed state for blocking backflow through a cooling fan.

FIG. 6B illustrates a backflow preventer assembly in an open state allowing airflow through a fan.

DETAILED DESCRIPTION

Figure 1:
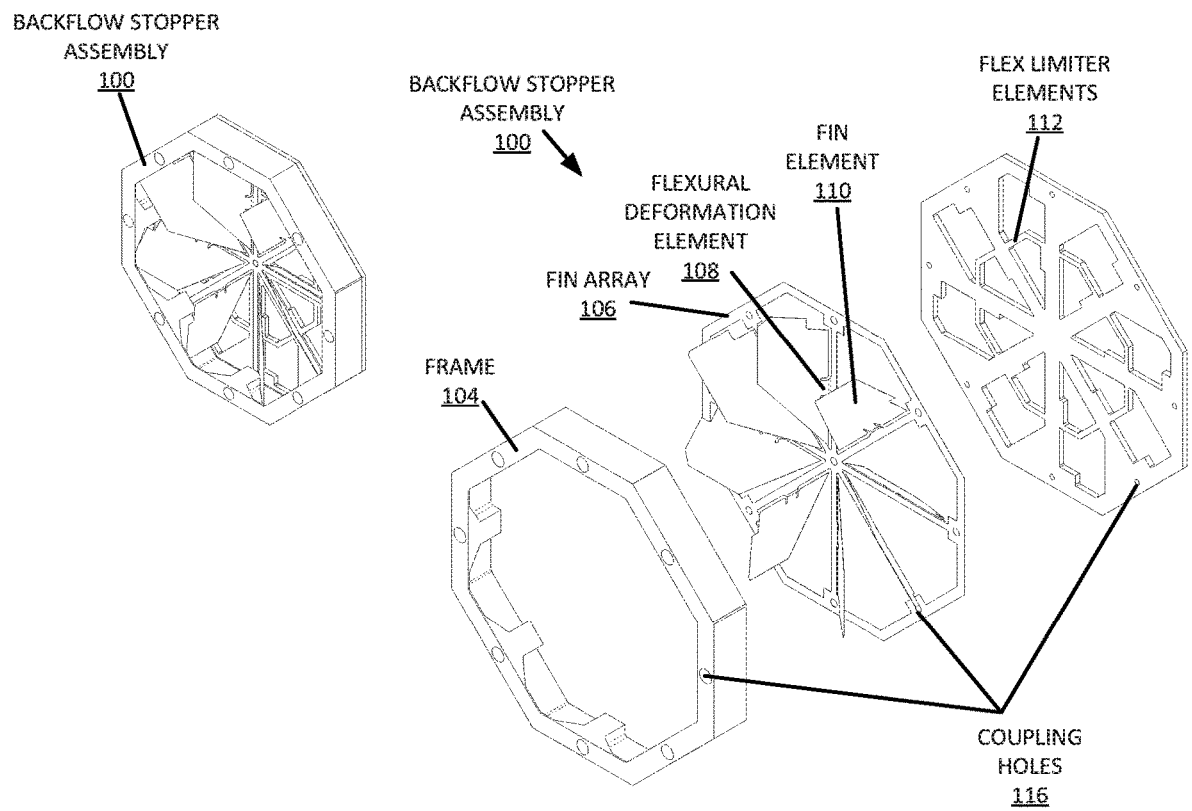
FIG. 1 illustrates an assembled view and an exploded view of backflow stopper assembly for preventing backflow through a cooling fan.

FIG. 1 illustrates an assembled view and an exploded view of backflow stopper assembly 100 for preventing backflow through a cooling fan. Backflow stopper assembly 100 comprises frame 104, fin array 106 and flex limiter elements 112. Frame 104 is configured to structurally support fin array 106 when coupled to a fan. Fin array 106 comprises a plurality of flexural deformation elements 108 and associated fin elements 110 arrayed in a radial arrangement to establish a pathway for airflow. Each of flexural deformation elements 108 is configured to move an attached fin element 110 responsive to airflow impacting attached fin element 110. Flex limiter elements 112 couple to frame 104 and are configured to limit flexure of fin elements 110 beyond a predetermined flexure in relation to frame 104 to stop backflow of air through fin array 106.

Frame 104 is configured to structurally support fin array 106 when coupled to a fan. Frame 104 comprises coupling holes 116 matching coupling holes 116 of fin array 106 and coupling holes 116 of flex limiter elements 112. Frame 104 structurally supports fin array 106 by coupling fin array 106 to frame 104 using mechanical fasteners configured to engage coupling holes 116. Suitable mechanical fasteners comprise screws, bolts, push-in rivets, snap-lock fasteners or other fastener compatible with coupling holes 116. Adhesives, tapes and welds can also be used to couple fin array 106 to frame 104. Alternatively, frame 104 can comprise a plate with holes for fasteners. In this example, frame 104 couples to fin array 106 by the compressive force of fasteners used to secure backflow stopper assembly 100 to a fan-mount bulkhead.

The configuration of frame 104 is selected, in part, by the fan coupled to frame 104. Suitable fan types include axial-flow, centrifugal and cross-flow, or other type fans, including combinations and variations thereof. Frame 104 geometry allows a maximum amount of airflow through frame 104 while coupled to a fan and occupies a minimal depth so that it can be installed inside of an electronics enclosure having limited space constraints. However, backflow stopper assembly can also be mounted on the exterior of an electronics enclosure. The depth of frame 104 is determined by the depth of fin array 106 when fin elements 110 are fully open. Frame 104 permits fin elements 110 to fully open without interfering with the fan.

Frame 104 is configurable to couple fin array 106 to a fan. FIG. 1 illustrates frame 104 and fin array 106 having coupling holes 116 so that mechanical fasteners can be used to couple fin array 106 to a fan. Suitable mechanical fasteners comprise screws, bolts, push-in rivets, snap-lock fasteners or other fastener compatible with coupling holes 116. Alternatively, fin array 106 can couple to frame 104 using snap-lock features. Adhesives, tapes and welds can also be used to couple fin array 106 to frame 104.

One or more flex limiter elements 112 couple to frame 104. FIG. 1 illustrates frame 104 and flex limiter elements 112 having coupling holes 116 so that mechanical fasteners can be used to couple frame 104 to flex limiter elements 112. Suitable mechanical fasteners comprise screws, bolts, push-in rivets, snap-lock fasteners or other fastener compatible with coupling holes 116. Alternatively, flex limiter elements 112 can couple to frame 104 using snap-lock features. Adhesives, tapes and welds can also be used to couple flex limiter elements 112 to frame 104.

FIG. 1 illustrates frame 104 having a void interior for airflow to pass through. Other examples of frame 104 can have a different configuration including interior structural members as will be shown below. Frame 104 as illustrated in FIG. 1 is comprised of only perimeter structure. Frame 104 is configurable to adapt to different fin array 106 and fan configurations.

Frame 104 can be manufactured from various materials comprising metals, alloys, polymers, ceramics, composites or some other material having desirable properties. The method of manufacturing frame 104 is dependent on the material used for construction. For example, metals or alloys can be machined or punched, while polymers can be injection molded or vacuum formed.

Fin array 106 comprises a plurality of flexural deformation elements 108 and associated fin elements 110 arrayed in a radial arrangement to establish a pathway for airflow, each flexural deformation element 108 is configured to move an attached fin element 110 responsive to airflow impacting attached fin element 110. Fin array 106 allows airflow to pass through in only one direction. Airflow passes through fin array 106 when fin elements 110 are in an open position and airflow is blocked when fin elements 110 are in a closed position. One or more flex limiter elements 112 can be used to limit flexure of fin elements 110 beyond a predetermined flexure in relation to frame 104 to stop backflow of air through the fin array.

Fin array 106 is configured to have a thin depth when fin elements 110 are in an open position permitting backflow stopper assembly 100 to be installed on the interior of an electronics enclosure having limited space constraints. Fin array 106 can be configured to open fin elements 110 to a pre-determined angle in relation to a plane parallel to fin array 106 to meet limited space constraints. For example, fin array 106 can be configured to open fin elements 110 to 40°, 45° or 90° in relation to a plane parallel to fin array 106. Opening fin elements 110 to 90° will consume a greater depth than opening fin elements 110 only 40° using the same fin array 106. Similarly, the size of fin elements 110 impacts the depth of fin array 106. Smaller and more numerous fin elements 110 will consume less depth than larger and less numerous fin elements 110 while permitting the same volume of airflow. Additionally, fin array 106 is configurable to default to either an open or closed state depending upon the intended application.

Fin array 106 is configurable to selectively open or close individual fin elements 110 via flexural deformation elements 108 responsive to airflow impacting individual fin elements 110. One way to configure fin array 106 to have selectively opening and closing fin elements 110 is to use different materials for flexural deformation elements 108. However, flexural deformation elements 108 can be made in several ways. Flexural deformation elements 108 can comprise a long beam. In the case of a long beam, flexural deformation elements 108 can utilize bending or torsional properties of the beam. FIG. 1 provides an example of flexural deformation elements 108 comprising a long beam that deforms in a torsional manner Flexural deformation elements 108 can be made from a thin section by selecting a thin sheet or by scoring (removing thickness locally). Additionally, flexural deformation elements can be made by narrowing a section of material to achieve desirable flexural deformation properties. For example, provided the thickness and material of flexural deformation elements 108 are generally equal, a wider flexural deformation element 108 will be less impacted than a narrower flexural deformation element 108 by the same airflow. FIG. 1 provides an example of flexural deformation elements 108 made by narrowing a section of material. Finally, a combination of all the above methods can be used to make flexural deformation elements 108.

Some considerations when selecting materials for flexural deformation elements 108 include cost, stiffness, and environmental factors. Flexural deformation elements 108 flex to open and close fin elements 110, therefore the stiffness, or the modulus of elasticity, affects how flexural deformation elements 108 react to changes in airflow. Stiffness of flexural deformation elements 108 can be adjusted when using the same piece of material for fin elements 110 and flexural deformation elements 108 by selectively removing material to form flexural deformation elements 108. FIG. 1 illustrates an example of flexural deformation elements 108 cut from the same piece of material as fin elements 110. Alternatively, flexural deformation elements 108 can comprise different materials than fin elements 110. In this case, both material selection and geometry of flexural deformation elements 108 will determine the stiffness of flexural deformation elements 108.

Environmental factors are considered when selecting material for flexural deformation elements 108 because backflow stopper assembly 100 can be used inside of electrical enclosures and must meet certain industry standards. In some examples, flexural deformation elements 108 can experience temperatures ranging from 40° C. to 60° C. in operation. Therefore, structural integrity of a material at temperature and pressure might be considered to prevent flexural deformation elements 108 from experiencing creep or otherwise losing shape at elevated operating temperatures and pressures. For example, flexural deformation elements 108 might have a U.L. approved fire rating of 94 V-0 or better. Metals, alloys, and flame retardant materials are good examples of materials that can be used for flexural deformation elements 108. High-density polyethylene or ITWFormex® provide two examples of materials that can be used for flexural deformation elements 108 and meet U.L. approved fire rating of 94 V-0 or better.

Various methods of manufacturing flexural deformation elements 108 can be employed depending upon the material selected. For example, some materials that can be used to make flexural deformation elements 108 are easily manufactured using stamping, die cutting or laser cutting operations. While other materials may be better suited to injection molding, vacuum forming, scoring or some other operations. In some examples, fin array 106 can be constructed from flexural deformation elements 108 made of one material and fin elements 110 from another. Dissimilar materials can be assembled into fin array 106 by using lamination techniques, adhesives, heat bonds or other mechanical joining processes.

Fin elements 110 close in the event of fan failure thereby preventing backflow that would compromise the efficiency of the cooling system. Flexural deformation elements 108 coupled to fin elements 110 flex to open and close fin elements 110. Flexural deformation elements 108 elements are configurable to react to changes in airflow and open and close fin elements 110 in response. The flexure of flexural deformation elements 108 can be configured by material selection and geometry. Fin elements 110 bear a minimal structural load by airflow in the open position. Fin elements 110 are structurally loaded by airflow in the closed position. Flex limiter elements 112 provide additional support to fin elements 110 when fin elements 110 experience load. Therefore, material strength is not a critical factor when selecting materials for fin elements 110.

Some considerations when selecting materials for fin elements 110 include cost, stiffness, and environmental factors. Environmental factors are considered when selecting material for fin elements 110 because backflow stopper assembly 100 can be used inside of electrical enclosures and must meet certain industry standards. For example, fin elements 110 might have a U.L. approved fire rating of 94 V-0 or better. In some examples, fin elements 110 can experience temperatures ranging from 40° C. to 60° C. in operation. Therefore, structural integrity of a material at temperature and pressure might be considered to prevent fin elements 110 from experiencing creep or otherwise losing shape at elevated operating temperatures and pressures. Metals, alloys, and flame retardant materials are good examples of materials that can be used for fin elements 110. High-density polyethylene or ITWFormex® provide two examples of materials that can be used for fin elements 110 and meet U.L. approved fire rating of 94 V-0 or better.

Various methods of manufacturing fin elements 110 can be employed depending upon the material selected. For example, some materials that can be used to make fin elements 110 are easily manufactured using stamping, die cutting and laser cutting operations. While other materials may be better suited to injection molding, vacuum forming, scoring or some other operations. In some examples, fin array 106 can be constructed from fin elements 110 made of one material and flexural deformation elements 108 from another. Dissimilar materials can be assembled into fin array 106 by using lamination techniques, adhesives, heat bonds or other mechanical joining processes.

One or more flex limiter elements 112 couple to frame 104 and are configured to limit flexure of fin elements 110 beyond a predetermined flexure in relation to frame 104 to stop backflow of air through fin array 106. FIG. 1 illustrates frame 104 and flex limiter elements 112 having coupling holes 116 so that mechanical fasteners can be used to couple frame 104 to flex limiter elements 112. Suitable mechanical fasteners comprise screws, bolts, push-in rivets, snap-lock fasteners or other fastener compatible with coupling holes 116. Alternatively, flex limiter elements 112 can couple to frame 104 using snap-lock features. Adhesives, tapes and welds can also be used to couple flex limiter elements 112 to frame 104.

Flex limiter elements 112 limit flexure of fin elements 110 beyond a predetermined flexure in relation to frame 104 to stop backflow of air through fin array 106 by providing mechanical interference with fin elements 110, thereby inhibiting further movement. FIG. 1 illustrates flex limiter elements 112 as a plate with material removed to permit airflow through flex limiter elements 112. Flex limiter elements 112 can be a mesh in some examples. Flex limiter elements 112 allow fin elements 110 to be constructed of lighter and more flexible materials by providing additional support to fin elements 110 during load. It is desirable for flex limiter elements 112 to be as thin as possible while still providing the necessary support to fin elements 110 to allow backflow stopper assembly 100 to be installed into electronic enclosures having limited space constraints. It is also desirable that flex limiter elements 112 have minimal structure to avoid negatively impacting airflow though backflow stopper assembly 100.

Flex limiter elements 112 can be constructed from a variety of materials. Some considerations when selecting materials for flex limiter elements 112 include cost, stiffness, and environmental factors. Environmental factors are considered when selecting material for flex limiter elements 112 because backflow stopper assembly 100 can be used inside of electrical enclosures and must meet certain industry standards. For example, flex limiter elements 112 might have a U.L. approved fire rating of 94 V-0 or better. Metals, alloys, polymers, ceramics, composites or other materials having desirable properties can be used to manufacture flex limiter elements 112.

Methods of manufacturing flex limiter elements 112 depend on the material used for construction. For example, some materials that can be used to make flex limiter elements 112 are easily manufactured using stamping, die cutting and laser cutting operations. While other materials may be better suited to injection molding, vacuum forming, scoring or some other operations.

Figure 2:
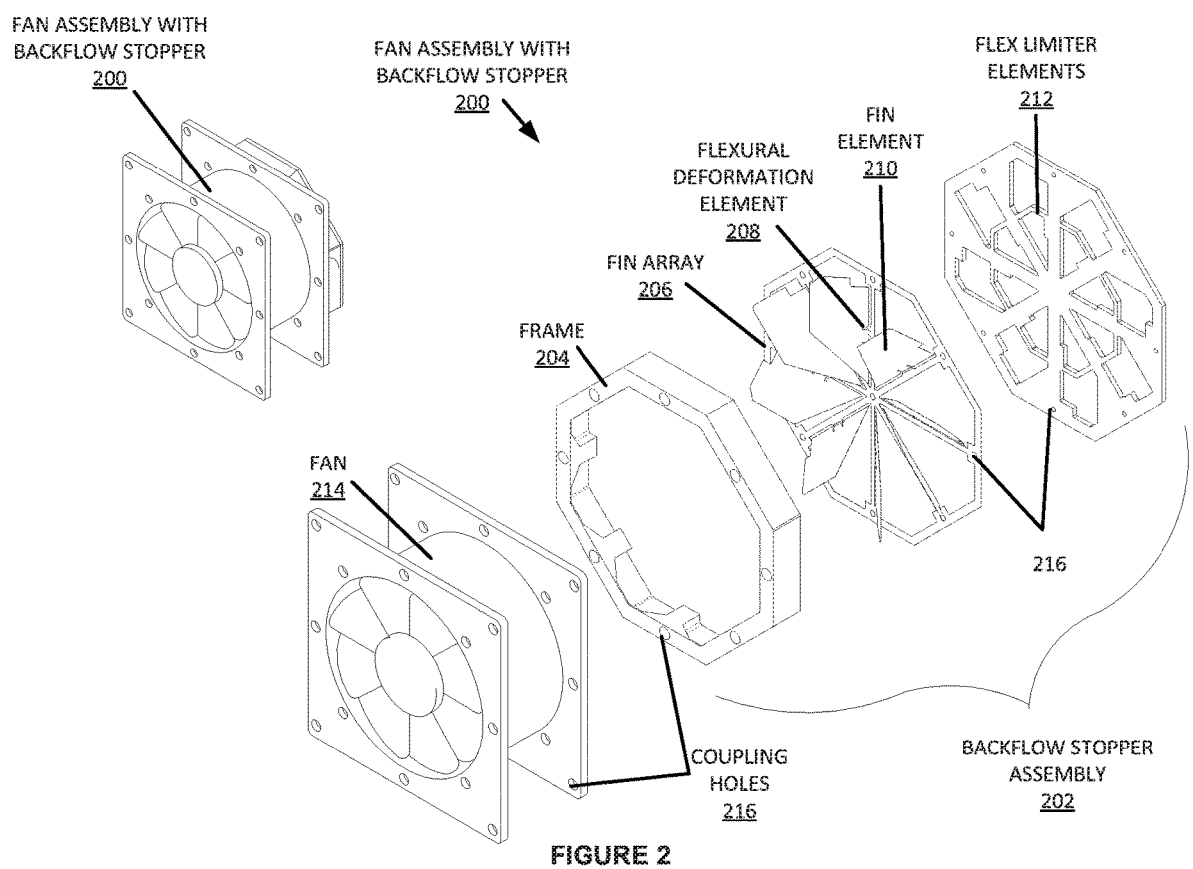
FIG. 2 illustrates an assembled view and an exploded view of fan assembly with a backflow stopper for preventing backflow through a cooling fan.

FIG. 2 illustrates an assembled view and an exploded view of fan assembly with a backflow stopper 200. Fan assembly with a backflow stopper 200 blocks airflow from passing through fan 214 in the event fan 214 fails. Allowing airflow to pass through fan 214 when fan 214 has failed can compromise the efficiency of the cooling system in an electronic enclosure because fan 214 provides a path of lesser resistance for airflow than moving over electronic components. Fan assembly with a backflow stopper 200 is designed to be compact so that it can fit in the interior of an electronics enclosure having limited space constraints. Fan assembly with a backflow stopper 200 can be installed into existing electronics enclosures by mounting to the bulkhead that supports the cooling system.

Fan assembly with a backflow stopper 200 comprises fan 214 and backflow stopper assembly 202. Fan 214 can be any type or configuration of fan. Backflow stopper assembly 202 is configurable to work with any fan. Typically, fan 214 will comprise an electronic fan used for cooling electronics enclosures.

Fan 214 comprises a mechanical fan with rotating blades to create airflow. Fan 214 can comprise an axial-flow, centrifugal or cross-flow, or some other type of fan, including combinations or variations. Axial-flow fans have blades that force air to move parallel to the shaft about which the blades rotate and are commonly used for cooling electronic equipment and typically comprise case mount frames for mounting the fan within an electronics enclosure. Fan 214 further comprises a motor. Some suitable motors for use with Fan 214 include AC, DC brushed or DC brushless motors.

Backflow stopper assembly 202 comprises frame 204, fin array 206 and flex limiter elements 212. Backflow stopper assembly 202 is an example of backflow stopper assembly 100; however backflow stopper assembly 202 can have alternative configurations and operations than backflow stopper assembly 100.

Backflow stopper assembly 202 comprises frame 204 configured to structurally support fin array 206 and couple fin array 206 to fan 214. Fin array 206 comprises a plurality of flexural deformation elements 208 and associated fin elements 210 arrayed in a radial arrangement to establish a pathway for airflow, each of flexural deformation elements 208 is configured to move an attached fin element 210 responsive to airflow impacting the attached fin element 210. Backflow stopper assembly 202 also comprises one or more flex limiter elements 212 coupled to frame 204 and configured to limit flexure of fin elements 210 beyond a predetermined flexure in relation to frame 204 to stop backflow of air through fin array 206.

Frame 204 is configured to structurally support fin array 206 when coupled to fan 214. Frame 204 is configurable to structurally support fin array 206 by coupling to fin array 206. The depth of frame 204 is determined by the depth of fin array 206. Frame 204 permits fin elements 210 to fully open without interfering with fan 214. FIG. 2 illustrates frame 204 and fin array 206 having coupling holes 216 so that mechanical fasteners can be used to couple frame 204 to fin array 206. Mechanical fasteners that can be used comprise screws, bolts, push-in rivets and other fasteners for use with coupling holes 216. Adhesives or tapes can also be used to couple frame 204 to fin array 206. Frame 204 can mechanically couple to fin array 206 using snap-fit geometry.

Frame 204 couples fin array 206 to fan 214. FIG. 2 illustrates frame 204 with coupling holes 216 so that mechanical fasteners can be used to couple frame 204 to fan 214. Suitable mechanical fasteners comprise screws, bolts, push-in rivets, snap-lock fasteners or other fastener compatible with coupling holes 116. Frame 204 can also couple to fin array 206 to fan 214 using snap-lock features.

One or more flex limiter elements 212 couple to frame 204. FIG. 2 illustrates frame 204 and flex limiter elements 212 having coupling holes 216 so that mechanical fasteners can be used to couple frame 204 to fin array 206. Suitable mechanical fasteners comprise screws, bolts, push-in rivets, snap-lock fasteners or other fastener compatible with coupling holes 216. Alternatively, one or more flex limiter elements 212 can couple to frame 204 using snap-lock features.

FIG. 2 illustrates frame 204 having a void interior for airflow to pass through. Other examples of frame 204 can have entirely different configurations as will be shown. For example, frame 204 can comprise interior structural members. Frame 204 as illustrated in FIG. 2 is comprised of only perimeter structure. Frame 204 is configurable to adapt to different fin array 206 and fan 214 configurations.

Frame 204 can be manufactured from various materials comprising metals, alloys, polymers, ceramics, composites or some other materials having desirable properties. The method of manufacturing frame 204 is dependent on the material used for construction. For example, metals or alloys can be machined or punched, while polymers can be injection molded or vacuum formed.

Fin array 206 comprises a plurality of flexural deformation elements 208 and associated fin elements 210 arrayed in a radial arrangement to establish a pathway for airflow, each flexural deformation element 208 is configured to move an attached fin element 210 responsive to airflow impacting attached fin element 210. Fin array 206 allows airflow to pass through in only one direction. Airflow passes through fin array 206 when fin elements 210 are in an open position and airflow is blocked when fin elements 210 are in a closed position. One or more flex limiter elements 212 limits flexure of fin elements 210 beyond a predetermined flexure in relation to frame 204 to stop backflow of air through fin array 206.

Fin array 206 is configured to have a thin depth when fin elements 210 are in an open position permitting fan assembly with a backflow stopper 200 to be installed on the interior of an electronics enclosure having limited space constraints. In some examples, backflow stopper 200 has a depth of less than 20 millimeters. Fin array 206 can be configured to open fin elements 210 to pre-determined angles in relation to a plane parallel to fin array 206 to meet limited space constraints. For example, fin array 206 can be configured to open fin elements 210 to 40°, 45° or 90° in relation to a plane parallel to fin array 206. Opening fin elements 210 to 90° will consume a greater depth than opening the same fin elements 210 only 40°. Similarly, the size of fin elements 210 impacts the depth of fin array 206. Smaller and more numerous fin elements 210 consume less depth than larger and less numerous fin elements 210 while permitting the same volume of airflow. Additionally, fin array 206 is configurable to default to either an open or closed state depending upon the intended application. In this example, fin array 206 defaults to an open state.

Fin array 206 is configurable to selectively open or close individual fin elements 210 via flexural deformation elements 208 responsive to airflow impacting the individual fin elements 210. Flexural deformation elements 208 are configured to move an attached fin element 210 responsive to airflow impacting fin element 210. Flexural deformation elements 208 can be configured to move an attached fin element 210 differing amounts responsive to the same airflow simply by changing the geometry of flexural deformation elements 208. For example, provided the thickness and material of the flexural deformation elements 208 are equal, a wider flexural deformation element 208 will be less impacted than a narrower flexural deformation element 208 by the same airflow. Another way to configure fin array 206 to have selectively opening and closing fin elements 210 is to use different materials for flexural deformation elements 208.

Fin array 206 can be formed from a single piece of a flexible material of a predetermined thickness that establishes an open state of fin array 206 when the airflow is provided by fan 214 and a closed state of fin array 206 when the airflow is in a direction opposite to that provided by fan 214. Alternatively, fin array 206 can be formed from a laminated assembly of one or more flexible materials with a first layer of the laminated assembly of a first thickness that establishes an open state of fin array 206 when the airflow is provided by fan 214 and a closed state of fin array 206 when the airflow is in a direction opposite to that provided by fan 214, and the second layer of the laminated assembly of a second thickness to form fin elements 210 and provide rigidity to fin elements 210.

Flexural deformation elements 208 can be made in several ways. Flexural deformation elements 208 can be configured to move an attached fin element 210 differing amounts responsive to the same airflow simply by changing the geometry of flexural deformation elements 208. Another way to configure fin array 206 to have selectively opening and closing fin elements 210 is to use different materials for flexural deformation elements 208. Flexural deformation elements 208 can comprise a long beam. In the case of a long beam, flexural deformation elements 208 can utilize bending or torsional properties of the beam. Flexural deformation elements 208 can be made from a thin section by selecting a thin sheet or by scoring (removing thickness locally). Additionally, flexural deformation elements can be made by narrowing a section of material to achieve desirable flexural deformation properties. For example, provided the thickness and material of the flexural deformation elements 208 are generally equal, a wider flexural deformation element 208 will be less impacted than a narrower flexural deformation element 208 by the same airflow. Finally, a combination of all the above methods can be used to make flexural deformation elements 208.

Some considerations when selecting materials for flexural deformation elements 208 include cost, stiffness, and environmental factors. Flexural deformation elements 208 flex to open and close fin elements 210, therefore the stiffness, or the modulus of elasticity, affects how flexural deformation elements 208 react to changes in airflow. Stiffness of flexural deformation elements 208 can be adjusted when using the same piece of material for fin elements 210 and flexural deformation elements 208 by selectively removing material to form flexural deformation elements 208. FIG. 2 illustrates an example of flexural deformation elements 208 cut from the same piece of material as fin elements 210. Alternatively, flexural deformation elements 208 can comprise different materials than fin elements 210. In this case, both material selection and geometry of flexural deformation elements 208 will determine the stiffness of flexural deformation elements 208.

Environmental factors are considered when selecting material for flexural deformation elements 208 because fan assembly with a backflow stopper 200 can be used inside of electronics enclosures and must meet certain industry standards. For example, flexural deformation elements 208 might have a U.L. approved fire rating of 94 V-0 or better. In some examples, flexural deformation elements 208 can experience temperatures ranging from 40° C. to 60° C. in operation. Therefore, structural integrity of a material at temperature and pressure might be considered to prevent flexural deformation elements 208 from experiencing creep or otherwise losing shape at elevated operating temperatures and pressures. Metals, alloys, and flame retardant materials are good examples of materials that can be used for flexural deformation elements 208. High-density polyethylene or ITWFormex® provide two examples of materials that can be used for flexural deformation elements 208 and meet U.L. approved fire rating of 94 V-0 or better.

Various methods of manufacturing flexural deformation elements 208 can be employed depending upon the material selected. For example, some materials that can be used to make flexural deformation elements 208 are easily manufactured using stamping, die cutting and laser cutting operations. While other materials may be better suited to injection molding, vacuum forming, scoring of some other operations. In some examples, fin array 206 can be constructed from flexural deformation elements 208 made of one material and fin elements 210 from another. Dissimilar materials can be assembled into fin array 206 by using lamination techniques, adhesives, heat bonds or other mechanical joining processes.

Fin elements 210 close in the event of fan 214 failures thereby preventing backflow that would compromise the efficiency of the cooling system. Flexural deformation elements 208 coupled to fin elements 210 flex to open and close fin elements 210. Flexural deformation elements 208 elements are configurable to react to changes in airflow and open and close fin elements 210 in response. The flexure of flexural deformation elements 208 can be configured by material selection and geometry. Fin elements 210 bear a minimal structural load by airflow in the open position. Fin elements 210 are structurally loaded by airflow in the closed position. Flex limiter elements 212 provide additional support to fin elements 210 when fin elements 210 experience load in the closed position. Therefore, material strength is not a critical factor when selecting materials for fin elements 210.

Some considerations when selecting materials for fin elements 210 include cost, stiffness, and environmental factors. Environmental factors are considered when selecting material for fin elements 210 because fan assembly with a backflow stopper 202 can be used inside of electrical enclosures and must meet certain industry standards. For example, fin elements 210 might have a U.L. approved fire rating of 94 V-0 or better. In some examples, fin elements 210 can experience temperatures ranging from 40° C. to 60° C. in operation. Therefore, structural integrity of a material at temperature and pressure might be considered to prevent fin elements 210 from experiencing creep or otherwise losing shape at elevated operating temperatures and pressures. Metals, alloys, and flame retardant materials are good examples of materials that can be used for fin elements 210. High-density polyethylene or ITWFormex® provide two examples of materials that can be used for fin elements 210 and meet U.L. approved fire rating of 94 V-0 or better.

Various methods of manufacturing fin elements 210 can be employed depending upon the material selected. For example, some materials that can be used to make fin elements 210 are easily manufactured using stamping, die cutting and laser cutting operations. While other materials may be better suited to injection molding, vacuum forming, scoring of some other operations. In some examples, fin array 206 can be constructed from fin elements 210 made of one material and flexural deformation elements 208 from another. Dissimilar materials can be assembled to make fin array 206 by using lamination techniques, adhesives, heat bonds or other mechanical joining processes.

One or more flex limiter elements 212 couple to frame 204 and are configured to limit flexure of fin elements 210 beyond a predetermined flexure in relation to frame 204 to stop backflow of air through fin array 206. Flex limiter elements 212 limit flexure of fin elements 210 beyond a predetermined flexure in relation to frame 204 to stop backflow of air through fin array 206 by providing mechanical interference with fin elements 210 thereby inhibiting further movement. Flex limiter elements 212 allow fin elements 210 to be constructed of lighter and more flexible materials by providing additional support to fin elements 210 during load. It is desirable for flex limiter elements 212 to be as thin as possible while still providing the necessary support to fin elements 210 to allow fan assembly with a backflow stopper 200 to be installed into electronics enclosures having limited space constraints. It is also desirable that flex limiter elements 212 have minimal structure to avoid negatively impacting airflow though fan assembly with a backflow stopper 200.

Various methods can be used to couple flex limiter elements 212 to frame 204. FIG. 2 illustrates frame 204 having coupling holes 216 so that mechanical fasteners can be used to couple one or more flex limiter elements 212 to frame 204. Suitable mechanical fasteners comprise screws, bolts, push-in rivets, snap-lock fasteners or other fastener compatible with coupling holes 216. Alternatively, flex limiter elements 212 can couple to frame 204 using snap-lock features. Adhesives, tapes and welds can also be used to couple flex limiter elements 212 to frame 204.

Flex limiter elements 212 can be constructed from a variety of materials. Some considerations when selecting materials for flex limiter elements 212 include cost, stiffness and environmental factors. Environmental factors are considered when selecting material for flex limiter elements 212 because fan assembly with a backflow stopper 200 can be used inside of electronics enclosures and must meet certain industry standards. For example, flex limiter elements 212 might have a U.L. approved fire rating of 94 V-0 or better. Metals, alloys, polymers, ceramics, composites or other materials having desirable properties can be used to manufacture flex limiter elements 212.

Methods of manufacturing flex limiter elements 212 depend on the material used for construction. For example, stamping operations or laser cutting are appropriate manufacturing methods if metals or alloys are used for flex limiter elements 212.

Figure 3:
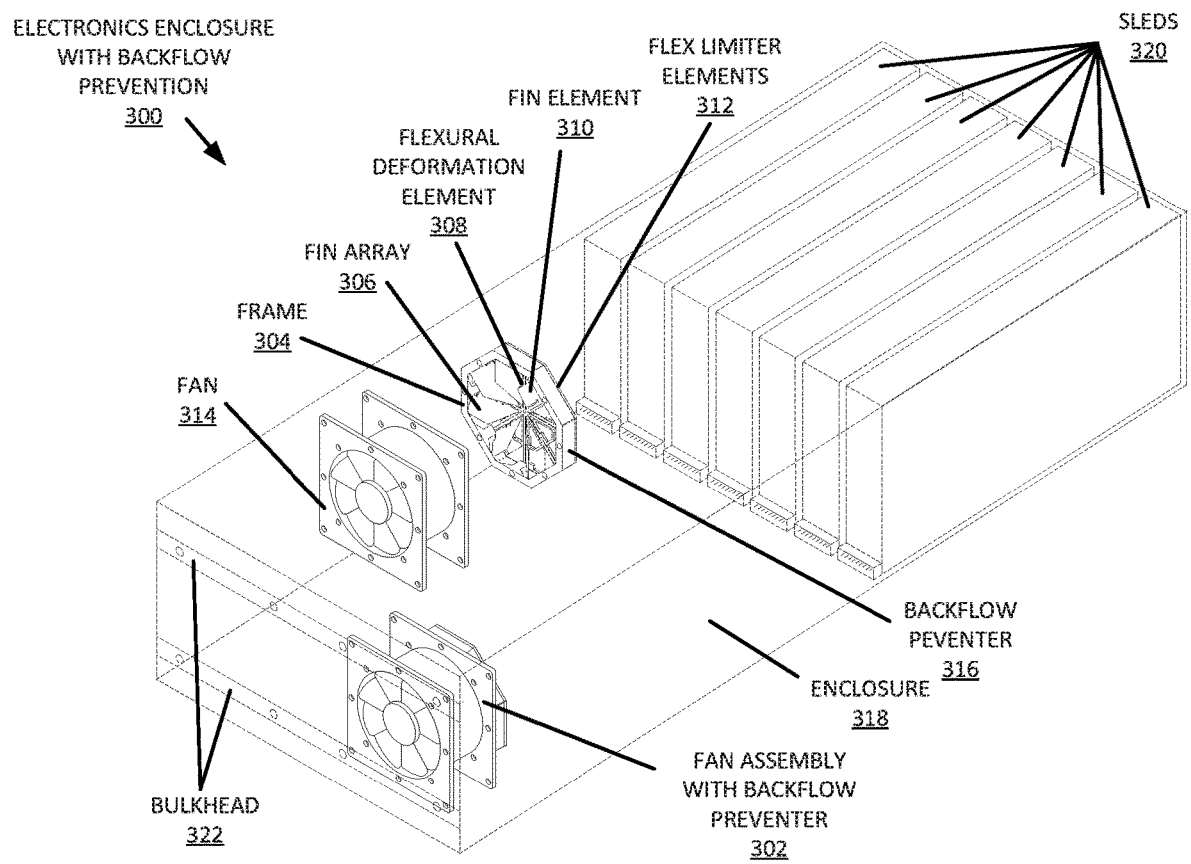
FIG. 3 illustrates an electronics enclosure with backflow prevention for preventing backflow through a cooling fan.

FIG. 3 illustrates electronics enclosure with backflow prevention 300 for housing and sleds 320 for supporting electronic devices. FIG. 3 illustrates enclosure 318 having excess interior room for the sake of illustration. Electronics enclosure with backflow prevention 300 includes one or more fan assemblies with backflow preventers 302. Fan assembly with a backflow preventer 302 provides an example of fan assembly with a backflow stopper 200; however fan assembly with a backflow preventer 302 can have alternative configurations and operations than fan assembly with a backflow stopper 200. Fan assembly with a backflow preventer 302 comprises fan 314 and backflow preventer 316. Backflow preventer 316 is an example of backflow stopper assembly 100 and backflow stopper assembly 202, however backflow preventer 316 can have alternative configurations and operations than backflow stopper assembly 100 or backflow stopper assembly 202.

Electronics enclosure with backflow prevention 300 comprises enclosure 318 configured to encase and support sleds 320 containing electronic devices and one or more fans 314 each with a corresponding backflow preventer 316. Backflow preventers 316 comprise frame 304, fin array 306 and flex limiter elements 312. Frame 304 is configured to structurally support fin array 306 and couple fin array 306 to fan 314. Fin array 306 comprises a plurality of flexural deformation elements 308 and associated fin elements 310 arrayed in a radial arrangement to establish a pathway for airflow, each of flexural deformation elements 308 is configured to move an attached fin element 310 responsive to airflow impacting attached fin element 310. Backflow preventer 316 further comprises one or more flex limiter elements 312 coupled to frame 304 and configured to limit flexure of fin elements 310 beyond a predetermined flexure in relation to frame 304 to stop backflow of air through fin array 306.

Enclosure 318 is configured to encase and support sleds 320 containing electronic devices. In some examples, enclosure 318 does not include sleds 320 or support structure for sleds 320. Sleds 320 provide structural and electrical support for a plurality of electronic devices arranges in an array. Electronic devices comprise data storage devices, computer processing units, routers and network elements, for example. Data storage devices comprise hard disk drives, solid state drives, and hybrid drives. Hybrid drives are data storage devices that couple a rotating magnetic media to a solid state memory for enhanced performance. Sleds 320 communicatively couple to electrical connectors within enclosure 318 to communicate with external devices.

Enclosure 318 includes bulkhead 322 for mounting cooling fans 314. Bulkhead 322 comprises structural elements for mounting cooling equipment, power and electrical connectors. Bulkhead 322 is typical of what would be found in an electronics enclosure, such as enclosure 318, for example. Fans 314 can be mounted on either on the interior or exterior of bulkhead 322. Likewise, backflow preventer 302 can be installed on either the interior or exterior of bulkhead 322. FIG. 3 illustrates fans 314 and backflow preventers 302 mounted on the interior of bulkhead 322. However, in some examples fans 314 can be mounted to the exterior of bulkhead 322 and backflow preventers 302 mounted to the interior of bulkhead 604 and vice-versa. Enclosure 318 can be manufactured from various materials comprising metals, alloys, polymers, ceramics, composites or other materials having desirable properties.

Electronics enclosure with backflow prevention 300 comprises one or more fans 314. Fans 314 can mount to bulkhead 322 either on the interior or exterior of enclosure 318. Likewise, backflow preventer 316 can be installed on either the interior or exterior of enclosure 318. FIG. 3 illustrates fan assembly with backflow preventer 302 mounted on the interior back-side of enclosure 318. However, fan assembly with backflow preventer 302 can be mounted to the front, top and bottom and interior and exterior of electronics enclosure 318. In some examples fans 314 can be mounted to the interior of enclosure 318 and backflow preventers 316 mounted to the exterior of enclosure 318 and vice-versa.

Fan 314 comprises a mechanical fan with rotating blades to create airflow. Fan 314 can comprise an axial-flow, centrifugal or cross-flow type fan, for example. Axial-flow fans have blades that force air to move parallel to the shaft about which the blades rotate and are commonly used for cooling electronic equipment and typically comprise case mount frames for mounting the fan within an electronics enclosure. Fan 314 further comprises a motor. Some suitable motors for use with Fan 214 include AC, DC brushed or DC brushless motors.

Frame 304 is configured to structurally support fin array 306 and couple fin array 306 to fan 314. Frame 304 is configurable to structurally support fin array 306 by coupling to fin array 306. The depth of frame 304 is determined by the depth of fin array 306. Frame 304 permits fin elements 310 to fully open without interfering with fan 314. Mechanical fasteners can be used to couple frame 304 to fin array 305. Suitable mechanical fasteners comprise screws, bolts, push-in rivets, snap-lock fasteners or other fasteners. Alternatively, frame 304 can couple fin array 306 to fan 314 using snap-lock features. Adhesives, tapes and welds can also be used to couple fin array 306 to frame 304. Alternatively, in some examples, frame 304 comprises an intermediate plate, compressed between fin array 306 and bulkhead 322 by fasteners secured into bulkhead 322.

One or more flex limiter elements 312 couple to frame 304. Mechanical fasteners can be used to couple flex limiter elements 312 to frame 304. Suitable mechanical fasteners comprise screws, bolts, push-in rivets, snap-lock fasteners or other fasteners. Alternatively, one or more flex limiter elements 312 can couple to frame 304 using snap-lock features. Adhesives, tapes and welds can also be used to couple one or more flex limiter elements 312 to frame 304.

Frame 304 can be manufactured from various materials comprising metals, alloys, polymers, ceramics, composites or some other materials having desirable properties. The method of manufacturing frame 304 is dependent on the material used for construction. For example, metals or alloys can be machined or punched, while polymers can be injection molded or vacuum formed.

Fin array 306 comprises a plurality of flexural deformation elements 308 and associated fin elements 310 arrayed in a radial arrangement to establish a pathway for airflow, each flexural deformation element 308 is configured to move an attached fin element 310 responsive to airflow impacting attached fin element 310. Fin array 306 allows airflow to pass through in only one direction. Airflow passes through fin array 306 when fin elements 310 are in an open position and airflow is blocked when fin elements 310 are in a closed position. One or more flex limiter elements 312 can be used to limit flexure of fin elements 310 beyond a predetermined flexure in relation to frame 304 to stop backflow of air through fin array 306.

Fin array 306 is configured to have a thin depth when fin elements 310 are in an open position permitting backflow preventer 316 to be installed on the interior of enclosure 318 having limited space constraints. Fin array 306 can be configured to open fin elements 310 to pre-determined angles in relation to a plane parallel to fin array 306 to meet limited space constraints. For example, fin array 306 can be configured to open fin elements 310 to 40°, 45° or 90° in relation to a plane parallel to fin array 306. Opening fin elements 310 to 90° will consume a greater depth than opening the same fin elements 310 only 40°. Similarly, the size of fin elements 310 impacts the depth of fin array 306. Smaller and more numerous fin elements 310 consume less depth than larger and less numerous fin elements 310 while permitting the same volume of airflow. Additionally, fin array 306 is configurable to default to either an open or closed state depending upon the intended application. In this example, fin array 306 defaults to an open state, thereby reducing load on fans 314 when operating.

Fin array 306 is configurable to selectively open or close individual fin elements 310 via flexural deformation elements 308 depending upon airflow impacting the individual fin elements 310. Flexural deformation elements 308 are configured to move an attached fin element 310 responsive to airflow impacting fin element 310. Flexural deformation elements 308 can be configured to move an attached fin element 310 differing amounts responsive to the same airflow simply by changing the geometry of flexural deformation elements 308. For example, provided the thickness and material of the flexural deformation elements 308 are equal, a wider flexural deformation element 308 will be less impacted than a narrower flexural deformation element 308 by the same airflow. Another way to configure fin array 306 to have selectively opening and closing fin elements 310 is to use different materials for flexural deformation elements 308.

Fin array 306 can be formed from a single piece of a flexible material of a predetermined thickness that establishes an open state of fin array 306 when the airflow is provided by fan 314 and a closed state of fin array 306 when the airflow is in a direction opposite to that provided by fan 314. Alternatively, fin array 306 can be formed from a laminated assembly of one or more flexible materials with a first layer of the laminated assembly of a first thickness that establishes an open state of fin array 306 when the airflow is provided by fan 314 and a closed state of fin array 306 when the airflow is in a direction opposite to that provided by fan 314, and the second layer of the laminated assembly of a second thickness to form fin elements 310 and provide rigidity to fin elements 310. Some considerations when selecting materials for flexural deformation elements 308 include cost, stiffness, and environmental factors. Flexural deformation elements 308 flex to open and close fin elements 310, therefore the stiffness, or the modulus of elasticity, affects how flexural deformation elements 308 react to changes in airflow. Stiffness of flexural deformation elements 308 can be adjusted when using the same piece of material for fin elements 310 and flexural deformation elements 308 by selectively removing material to form flexural deformation elements 308. Flexural deformation elements 308 can be cut from the same piece of material as fin elements 310. Alternatively, flexural deformation elements 308 can comprise different materials than fin elements 310. In this case, both material selection and geometry of flexural deformation elements 308 will determine the stiffness of flexural deformation elements 308.

Environmental factors are considered when selecting material for flexural deformation elements 308 because backflow preventer 316 can be used inside of enclosure 318 and must meet certain industry standards. For example, flexural deformation elements 308 might have a U.L. approved fire rating of 94 V-0 or better. In some examples, flexural deformation elements 308 can experience temperatures ranging from 40° C. to 60° C. in operation. Therefore, structural integrity of a material at temperature and pressure might be considered to prevent flexural deformation elements 308 from experiencing creep or otherwise losing shape at elevated operating temperatures and pressures. Metals, alloys, and flame retardant materials are good examples of materials that can be used for flexural deformation elements 308. High-density polyethylene or ITWFormex® provide two examples of materials that can be used for flexural deformation elements 308 and meet U.L. approved fire rating of 94 V-0 or better.

Various methods of manufacturing flexural deformation elements 308 can be employed depending upon the material selected. For example, some materials that can be used to make flexural deformation elements 308 are easily manufactured using stamping, die cutting and laser cutting operations. While other materials may be better suited to injection molding, vacuum forming, scoring or some other operations. In some examples, fin array 306 can be constructed from flexural deformation elements 308 made of one material and fin elements 310 from another. Dissimilar materials can be assembled to form fin array 306 by using lamination techniques, adhesives, heat bonds or other mechanical joining processes.

Fin elements 310 close in the event of fan 314 failures thereby preventing backflow that would compromise the efficiency of the cooling system. Flexural deformation elements 308 coupled to fin elements 310 flex to open and close fin elements 310. Flexural deformation elements 308 elements are configurable to react to changes in airflow and open and close fin elements 310 in response. The flexure of flexural deformation elements 308 can be configured by material selection and geometry. Fin elements 310 bear a minimal structural load by airflow in the open position. Fin elements 310 are structurally loaded by airflow in the closed position. Flex limiter elements 312 provide additional support to fin elements 310 when fin elements 310 experience load in the closed position. Therefore, material strength is not a critical factor when selecting materials for fin elements 310.

Some considerations when selecting materials for fin elements 310 include cost, stiffness, and environmental factors. Environmental factors are considered when selecting material for fin elements 310 because fan assembly with a backflow preventer 302 can be used inside of enclosure 318 and must meet certain industry standards. For example, fin elements 310 might have a U.L. approved fire rating of 94 V-0 or better. In some examples, fin elements 310 can experience temperatures ranging from 40° C. to 60° C. in operation. Therefore, structural integrity of a material at temperature and pressure might be considered to prevent fin elements 310 from experiencing creep or otherwise losing shape at elevated operating temperatures and pressures. Metals, alloys, and flame retardant materials are good examples of materials that can be used for fin elements 310. High-density polyethylene or ITWFormex® provide two examples of materials that can be used for fin elements 310 and meet U.L. approved fire rating of 94 V-0 or better.

Various methods of manufacturing fin elements 310 can be employed depending upon the material selected. For example, some materials that can be used to make fin elements 310 are easily manufactured using stamping, die cutting and laser cutting operations. While other materials may be better suited to injection molding, vacuum forming, scoring or some other operations. In some examples, fin array 306 can be constructed from fin elements 310 made of one material and flexural deformation elements 308 from another. Dissimilar materials can be assembled to make fin array 306 by using lamination techniques, adhesives, heat bonds or other mechanical joining processes.

One or more flex limiter elements 312 couple to frame 304 and are configured to limit flexure of fin elements 310 beyond a predetermined flexure in relation to frame 304 to stop backflow of air through fin array 306. Flex limiter elements 312 limit flexure of fin elements 310 beyond a predetermined flexure in relation to frame 304 to stop backflow of air through fin array 306 by providing mechanical interference with fin elements 310 thereby inhibiting further movement. Flex limiter elements 312 allow fin elements 310 to be constructed of lighter and more flexible materials by providing additional support to fin elements 310 during load. It is desirable for flex limiter elements 312 to be as thin as possible while still providing the necessary support to fin elements 310 to allow fan assembly with a backflow preventer 302 to be installed into electrical enclosures having limited space constraints. It is also desirable that flex limiter elements 312 have minimal structure to avoid negatively impacting airflow though fan assembly with a backflow preventer 302.

Various methods can be used to couple flex limiter elements 312 to frame 304. Mechanical fasteners can be used to couple flex limiter elements 312 to frame 304. Suitable mechanical fasteners comprise screws, bolts, push-in rivets, snap-lock fasteners or other fasteners. Alternatively, flex limiter elements 312 can couple to frame 304 using snap-lock features. Adhesives, tapes and welds can also be used to couple flex limiter elements 312 to frame 304.

Flex limiter elements 312 can be constructed from a variety of materials. Some considerations when selecting materials for flex limiter elements 312 include cost, stiffness, and environmental factors. Environmental factors are considered when selecting material for flex limiter elements 312 because backflow preventer 316 can be used inside of enclosure 318 and must meet certain industry standards. For example, flex limiter elements 312 might have a U.L. approved fire rating of 94 V-0 or better. Metals, alloys, polymers, ceramics, composites or some other materials having desirable properties can be used to manufacture flex limiter elements 312.

Methods of manufacturing flex limiter elements 312 depend on the material used for construction. For example, some materials that can be used to make fin elements 312 are easily manufactured using stamping, die cutting and laser cutting operations. While other materials may be better suited to injection molding, vacuum forming, or scoring operations. Alternatively, flex limiter elements can be manufactured using polymers and injection molding techniques.

Figure 4A:
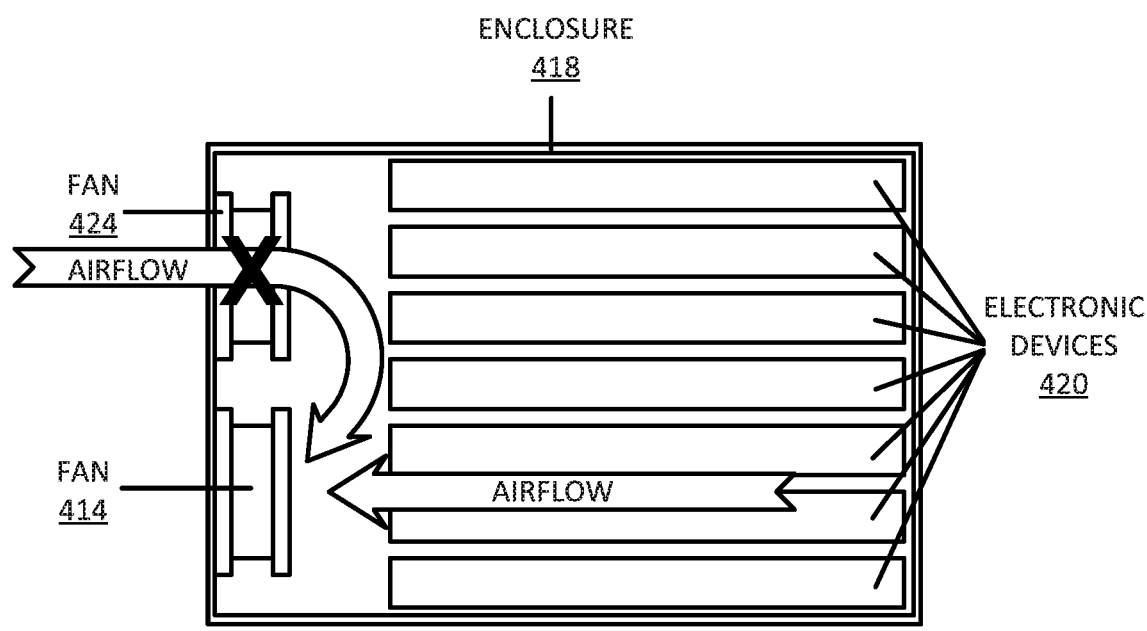
FIG. 4A illustrates airflow within an electronics enclosure when a cooling fan fails without backflow stopper assemblies installed.
Figure 4B:
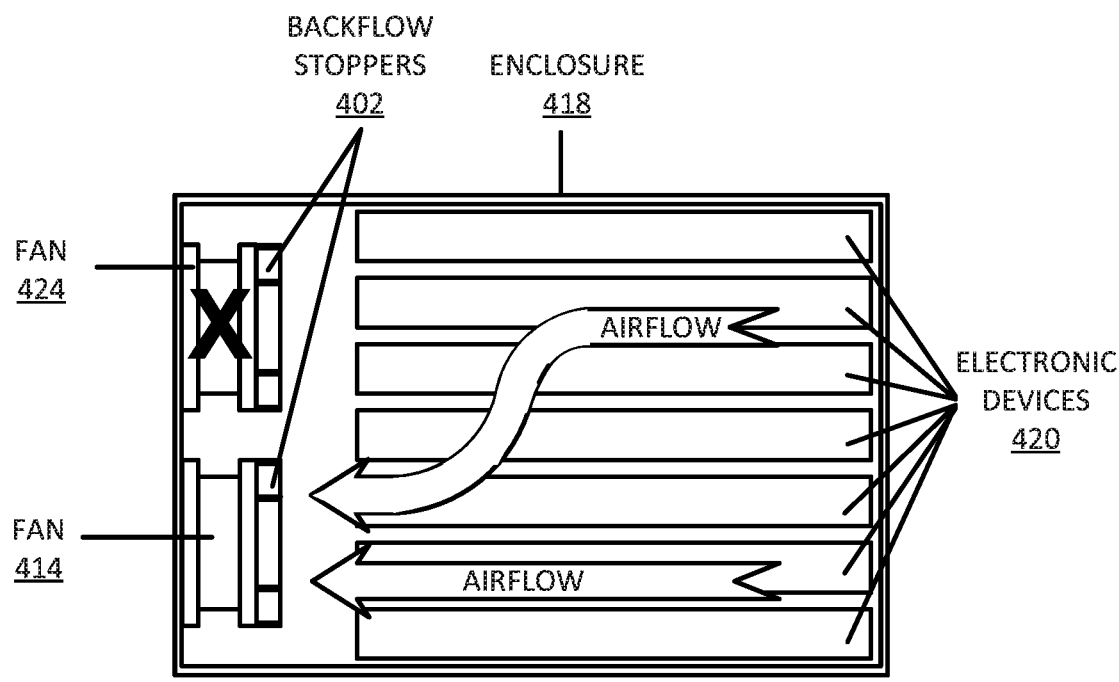
FIG. 4B illustrates airflow within an electronics enclosure when a cooling fan fails with backflow stopper assemblies installed.

FIGS. 4A and 4B illustrate the operation of backflow stoppers 402 within enclosure 418. Backflow stopper 402 is an example of backflow stopper assembly 100, backflow stopper assembly 202 and backflow preventer 316; however backflow stopper 402 may have alternative configurations and methods of operation than backflow stopper assembly 100, backflow stopper assembly 202 and backflow preventer 316.

During normal operation airflow is drawn from the front of enclosure (illustrated as the right side of enclosure 418 in FIGS. 4A and 4B) evenly past electronic devices 420, absorbing heat from electronic devices 420, and exhausted out the back of enclosure 418 (illustrated as the left side of enclosure 418 in FIGS. 4A and 4B). Some examples of enclosure 418 allow airflow to be drawn in from the top, bottom, and sides of enclosure 418. Fan 424 failure will result in similar inefficient airflow modes when fan 424 fails in either example. Therefore, for the sake of simplicity in explanation, it is assumed that during normal operation airflow is drawn evenly from the front to the back of enclosure 418 to cool electronic devices 420.

FIG. 4A illustrates airflow within enclosure 418 when fan 424 fails and does not have backflow stopper 402 installed. When fan 424 fails without a backflow stopper 402, failing fan 424 becomes the path of least resistance for airflow. In this example fan 414 is still operational after fan 424 fails. Fan 414 draws some airflow past electronic devices 420, however failing fan 424 provides a pathway for airflow with lesser resistance than airflow drawn from the front of enclosure 418 and past electronic devices 420 thereby circumventing cooling airflow past electronic devices 420.

FIG. 4B illustrates airflow within enclosure 418 when fan 424 fails and backflow stoppers 402 are installed. Enclosure 418 comprises backflow stoppers 402, fan 416, electronic devices 420, and failing fan 424. Backflow stopper 402 closes fin elements thereby blocking backflow through fan 424 when fan 424 fails. Fan 424 is no longer the pathway for least resistance as in FIG. 4A. Fan 414 continues to draw air from the front of enclosure 418, past electronic devices 420 and exhausts the air out of the back of enclosure 418.

Figure 5:
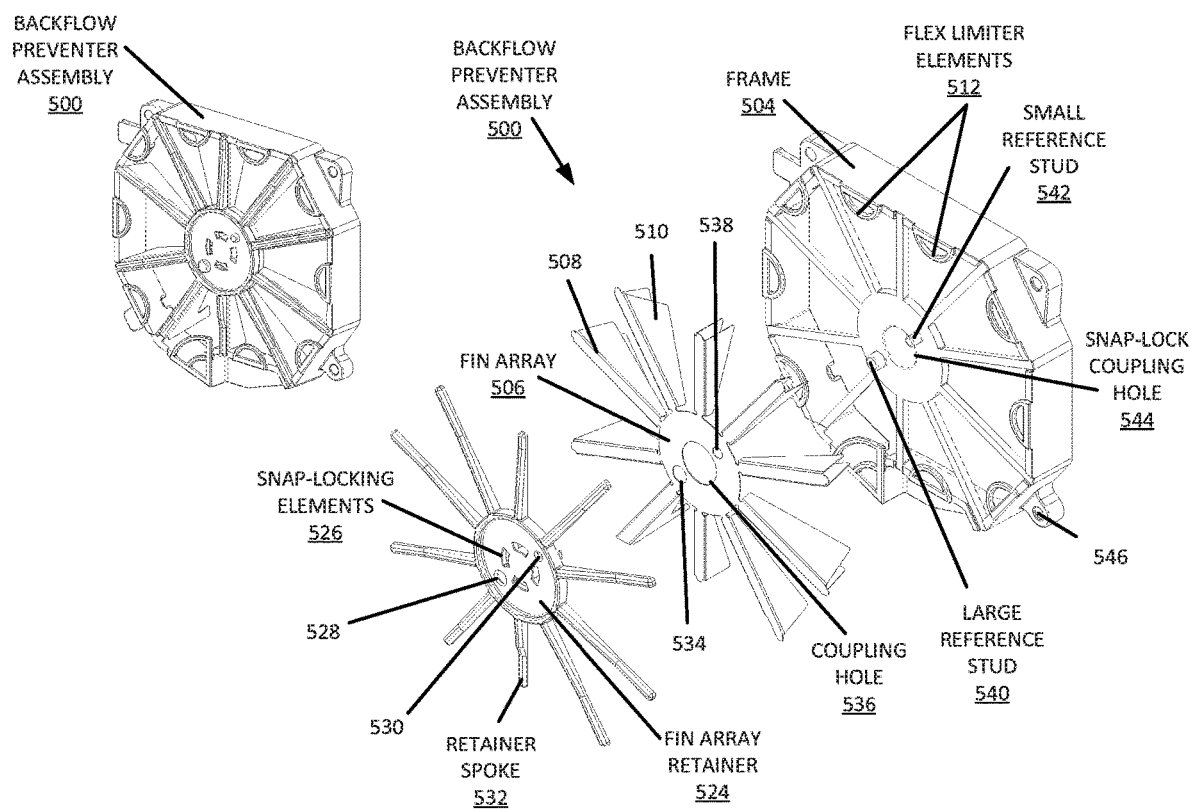
FIG. 5 illustrates an assembled view and an exploded view of backflow preventer assembly for preventing backflow through a cooling fan.

FIG. 5 illustrates an assembled view and an exploded view of backflow preventer assembly 500. Backflow preventer assembly 500 is an example of backflow stopper assembly 100, backflow stopper assembly 202, backflow preventer 316 and backflow stopper 402; however backflow preventer assembly 500 may have alternative configurations and methods of operation than backflow stopper assembly 100, backflow stopper assembly 202, backflow preventer 316 and backflow stopper 402.

Backflow preventer assembly 500 comprises frame 504, fin array 506 and fin array retainer 524. Frame 504 is configured to structurally support fin array 506 and couple fin array 506 to a fan. Fin array 506 comprises a plurality of flexural deformation elements 508 and associated fin elements 510 arrayed in a radial arrangement to establish a pathway for airflow, each of flexural deformation elements 508 is configured to move an attached fin element 510 responsive to airflow impacting attached fin element 510. One or more flex limiter elements 512 integral to frame 504 are configured to limit flexure of fin elements 510 beyond a predetermined flexure in relation to frame 504 to stop backflow of air through fin array 506.

Backflow preventer assembly 500 comprises frame 504, fin array 506 and fin array retainer 524 coupled together by snap-locking elements 526 to create a complete backflow preventer assembly 500. Frame 504 comprises large reference stud 540 and small reference stud 542 to position fin array 506 and fin array retainer 524 in relation to frame 504 and each other. Fin array 506 comprises pairs of fin elements 510 that open and close fin elements 510 in opposing pairs responsive to airflow allowing fin array 506 to have less depth than using a single fin element 510 to cover the same surface area. In this example, backflow preventer assembly 500 has a depth of less than 20 millimeters. Fin limiter elements 512 are integral to frame 504 in this example.

Frame 504 is configured to structurally support fin array 506 and couple fin array 506 to a fan. Frame 504 comprises large reference stud 540 and small reference stud 542 configured to engage large reference hole 534 and small reference hole 538 of fin array 506 to position fin array 506 in relation to frame 504. Large reference stud 540 and small reference stud 542 also engage large reference hole 528 and small reference hole 530 of fin array retainer 524 to position fin array retainer 524 in relation to frame 504 an fin array 506. Frame 504 includes interior spoke-like structural members radiating outward from a central hub to structurally support fin array 506 between flexural deformation elements 508 and fin elements 510. Fin array retainer 524 structurally supports fin array 506 by applying pressure to fin array 506 against the spoke-like structural members of frame 504 by engaging snap-locking elements 526 of fin array retainer 524 with coupling hole 536 of fin array 506 and snap-lock coupling hole 544 of frame 504. Frame 504 includes fan coupling holes 546 for coupling fin array 506 to a fan. Frame 504 is comprised of an injection moldable polymer. Frame 504 is manufactured using injection molding methods.

Fin array 506 comprises a plurality of flexural deformation elements 508 and associated fin elements 510 arrayed in a radial arrangement to establish a pathway for airflow, each of flexural deformation elements 508 is configured to move an attached fin element 510 responsive to airflow impacting attached fin element 510. Fin array 506 allows airflow to pass through in only one direction. Airflow passes through fin array 506 when fin elements 510 are in an open position and airflow is blocked when fin elements 510 are in a closed position. FIG. 5 illustrates fin array 506 with fin elements 510 fully open. While not illustrated in FIG. 5, fin array 506 further comprises one or more flexural deformation elements 508 each individually configurable to flex and move an attached fin element 510 a pre-determined amount in relation to other flexural limiting elements 508 and fin elements responsive 510 to airflow. This allows backflow preventer assembly 500 to mitigate detrimental impact caused to airflow within an electronics enclosure in the event that the fan is failing, but has not completely failed. Backflow preventer assembly 500 can close a portion of fin elements 510 responsive to airflow. For example, if the fan is only operating at one-half capacity, flexural limiting elements 508 can close one-half of fin elements 510. Fin array 506 defaults to an open state in this example.

Flexural deformation elements 508 couple to fin elements 510 and open and close fin elements 510 by flexing. Flexural deformation elements 508 can be configured to respond differently to particular airflows. For example, flexural deformation elements 508 having a high degree of stiffness, or a high modulus of elasticity, will not flex as much as flexural deformation elements 508 having a lower degree of stiffness, or modulus of elasticity, given the same airflow. Thus, flexural deformation elements 508 can be configured to flex in response to varying airflows.

Flexural deformation elements 508 can be made in several ways. Flexural deformation elements 508 can be configured to move an attached fin element 510 differing amounts responsive to the same airflow simply by changing the geometry of flexural deformation elements 508. Another way to configure fin array 506 to have selectively opening and closing fin elements 510 is to use different materials for flexural deformation elements 508. Flexural deformation elements 508 can comprise a long beam. In the case of a long beam, flexural deformation elements 508 can utilize bending or torsional properties of the beam. Flexural deformation elements 508 can be made from a thin section by selecting a thin sheet or by scoring (removing thickness locally). FIG. 5 provides an example of flexural deformation elements 508 by selecting a thin sheet. Additionally, flexural deformation elements can be made by narrowing a section of material to achieve desirable flexural deformation properties. For example, provided the thickness and material of the flexural deformation elements 508 are generally equal, a wider flexural deformation element 508 will be less impacted than a narrower flexural deformation element 508 by the same airflow. Finally, a combination of all the above methods can be used to make flexural deformation elements 508.

In this example, fin array 506 comprises flexural deformation elements 508 and fin elements 510 comprised of a laminated assembly of one or more flexible materials with a first layer of the laminated assembly of a first thickness that establishes an open state of fin array 506 when the airflow is provided by the fan and a closed state of fin array 506 when the airflow is in a direction opposite to that provided by the fan, and the second layer of the laminated assembly of a second thickness to form fin elements 510 and provide rigidity to fin elements 510.

Fin array 506 includes large reference hole 534 and small reference hole 538 for positioning fin array 506 in relation to frame 504. Snap-locking elements 526 of fin array retainer 524 engage fan coupling hole 546 of fin array 506 and snap-lock coupling hole 544 of frame 504 to hold backflow preventer assembly 500 together.

Some considerations when selecting materials for flexural deformation elements 508 include cost, stiffness, and environmental factors. Flexural deformation elements 508 flex to open and close fin elements 510, therefore the stiffness, or the modulus of elasticity, affects how flexural deformation elements 508 react to changes in airflow. Stiffness of flexural deformation elements 508 can be configured to flex in response to differing airflows by selecting, material, thickness and by selectively removing material to form flexural deformation elements 508.

Environmental factors are considered when selecting material for flexural deformation elements 508 because backflow preventer assembly 500 can be used inside of an electronics enclosure and must meet certain industry standards. For example, flexural deformation elements 508 might have a U.L. approved fire rating of 94 V-0 or better. In some examples, flexural deformation elements 508 can experience temperatures ranging from 40° C. to 60° C. in operation. Therefore, structural integrity of a material at temperature and pressure might be considered to prevent flexural deformation elements 508 from experiencing creep or otherwise losing shape at elevated operating temperatures and pressures. Metals, alloys, and flame retardant materials are good examples of materials that can be used for flexural deformation elements 508. High-density polyethylene or ITWFormex® provide two examples of materials that can be used for flexural deformation elements 508 and meet U.L. approved fire rating of 94 V-0 or better.

Fin elements 510 close in the event of cooling fan failure thereby preventing backflow that would compromise the efficiency of the cooling system. Flexural deformation elements 508 coupled to fin elements 510 flex to open and close fin elements 510. Flexural deformation elements 508 elements are configurable to react to changes in airflow and open and close fin elements 510 in response. The flexure of flexural deformation elements 508 can be configured by material selection and geometry. Fin elements 510 bear a minimal structural load by airflow in the open position. Fin elements 510 are structurally loaded by airflow in the closed position. Flex limiter elements 512 provide additional support to fin elements 510 when fin elements 510 experience load in the closed position. Therefore, material strength is not a critical factor when selecting materials for fin elements 510.

Some considerations when selecting materials for fin elements 510 include cost, stiffness, and environmental factors. Environmental factors are important to consider when selecting material for fin elements 510 because backflow preventer assembly 500 can be used inside of electronics enclosures and must meet certain industry standards. For example, fin elements 510 might have a U.L. approved fire rating of 94 V-0 or better. In some examples, fin elements 510 can experience temperatures ranging from 40° C. to 60° C. in operation. Therefore, structural integrity of a material at temperature and pressure might be considered to prevent fin elements 510 from experiencing creep or otherwise losing shape at elevated operating temperatures and pressures. Metals, alloys, and flame retardant materials are good examples of materials that can be used for fin elements 510. High-density polyethylene or ITWFormex® provide two examples of materials that can be used for fin elements 510 and meet U.L. approved fire rating of 94 V-0 or better.

Various methods of manufacturing fin elements 510 can be employed depending upon the material selected. For example, some materials that can be used to make fin elements 510 are easily manufactured using stamping, die cutting and laser cutting operations. While other materials may be better suited to injection molding, vacuum forming, scoring or some other operations.

FIG. 5 illustrates backflow preventer assembly 500 having multiple flex limiter elements 512 integral to frame 504 configured to limit flexure of fin elements 510 beyond a predetermined flexure in relation to frame 504 to stop backflow of air through fin array 506. Flex limiter elements 512 limit flexure of fin elements 510 beyond a predetermined flexure in relation to frame 504 to stop backflow of air through fin array 506 by providing mechanical interference with fin elements 510 thereby inhibiting further movement. Flex limiter elements 512 allow fin elements 510 to be constructed of lighter and more flexible materials by providing additional support to fin elements 510 during load. It is desirable that flex limiter elements 512 have minimal structure to avoid negatively impacting airflow though backflow preventer assembly 500.

Fin array retainer 524 comprises snap-locking elements 526, large reference hole 528, small reference hole 530, and retainer spokes 532. Snap-locking elements 526 engage coupling hole 536 of fin array 506 and snap-lock coupling hole 544 of frame 504 to hold backflow preventer assembly 500 together. Large reference hole 528 and small reference hole 530 position fin array retainer 524 in relation to frame 504 and fin array 506. Retainer spokes 532 provide structural support for fin array 506 by securing fin array 506 to frame 504. Fin array retainer is manufactured from injection moldable polymer by an injection molding process.

FIGS. 6A and 6B illustrate the operation of backflow preventer assembly 500. FIG. 6A illustrates backflow preventer assembly 500 in a closed state to prevent backflow of air through fin elements 510. Fin elements 510 are in contact with flex limiter elements 512 in the closed position providing fin elements 510 with additional structural support. FIG. 6B illustrates backflow preventer assembly 500 in an open state allowing airflow through fin elements 510.

FIG. 6A illustrates an example of backflow preventer assembly 500 in a closed state to prevent backflow of air through a fan. While the fan is not illustrated in FIG. 6A it is assumed for the sake of explanation that the fan has failed and flexural deformation elements 508 have closed fin elements 510 to prevent backflow of air through the fan. A plurality of flex limiter elements 510 integral to frame 504 provide additional structural support to fin elements 510 when fin elements 510 experience load. FIG. 6A illustrates fin elements 510 blocking airflow.

FIG. 6B illustrate an example of backflow preventer assembly 500 in an open state allowing airflow through a fan. While the fan is not illustrated in FIG. 6B it is assumed for the sake of illustration that the fan is operational and flexural deformation elements 508 are in a default open state. FIG. 6B illustrates airflow through the pathway for airflow of fin array 506.

Figure 7:
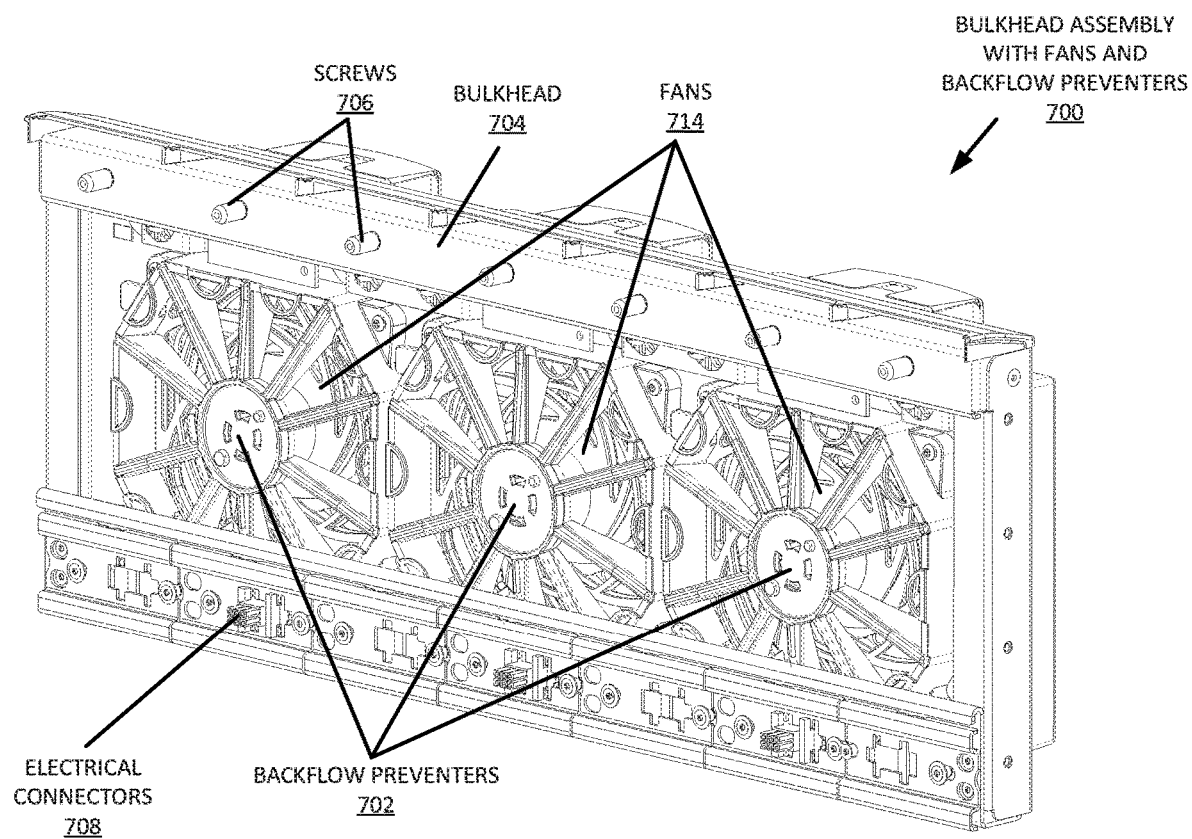
FIG. 7 illustrates a bulkhead assembly with fans and backflow preventers for preventing backflow through the cooling fans.

FIG. 7 illustrates bulkhead assembly with fans and backflow preventers 700 similar to what is typically found in electronic enclosures such as enclosure 318 or enclosure 418, for example. Backflow preventer 702 is an example of backflow stopper assembly 100, backflow stopper assembly 202, backflow preventer 316, backflow stopper 402 and backflow preventer assembly 500; however backflow preventer 602 may have alternative configurations and methods of operation than backflow stopper assembly 100, backflow stopper assembly 202, backflow preventer 316, backflow stopper 402 and backflow preventer assembly 500.

Bulkhead assembly with fans and backflow preventers 700 comprises a plurality of backflow preventers 702, bulkhead 704, screws 706, a plurality of electrical connectors 708, and a plurality of fans 714. Backflow preventers 702 are coupled to fans 714. Fans 714 mount to bulkhead 704 using screws 706. Electrical connectors 708 communicatively couple to electronic devices, such as data storage devices held inside an electronics enclosure.

Backflow preventers 702 block airflow through fans 714 in the event one or more fans 714 fails, thereby blocking the path of least resistance for airflow and forcing airflow to continue passing over electronic components within the electronics enclosure. FIG. 7 illustrates fans 714 in working order and backflow preventers 702 in an open state allowing airflow to pass through backflow preventers 702.

Bulkhead 704 comprises structural elements for mounting cooling equipment, power and electrical connectors. Bulkhead 704 is typical of what would be found in an electronics enclosure, such as enclosure 318, for example. Fans 714 can be mounted on either on the interior or exterior of bulkhead 704. Likewise, backflow preventer 702 can be installed on either the interior or exterior of bulkhead 704. FIG. 7 illustrates fans 714 and backflow preventers 702 mounted on the interior of bulkhead 704. However, in some examples fans 714 can be mounted to the exterior of bulkhead 704 and backflow preventers 702 mounted to the interior of bulkhead 704 and vice-versa.

Backflow preventers 702 comprise a frame configured to structurally support a fin array when coupled to fans 714. The fin array comprising a plurality of flexural deformation elements and associated fin elements arrayed in a radial arrangement to establish a pathway for airflow, each of the flexural deformation elements configured to move an attached fin element responsive to airflow impacting the attached fin element; and one or more flex limiter elements coupled to the frame and configured to limit flexure of the fin elements beyond a predetermined flexure in relation to the frame to stop backflow of air through the fin array.

Backflow preventers 702 block airflow through fans 714 when the fin array is in a closed state. Flexural deformation elements couple to fin elements and open and close fin elements by flexing. The flexibility of flexural deformation elements determines how fin array will react to differing airflows. Flexural deformation elements having a high degree of stiffness, or modulus of elasticity, will flex less than flexural deformation elements having a lesser degree of stiffness, or modulus of elasticity, given the same airflow.

The fin array can be formed from a single piece of a flexible material of a predetermined thickness that establishes an open state of the fin array when the airflow is provided by the fan and a closed state of the fin array when the airflow is in a direction opposite to that provided by the fan. Alternatively, the fin array can be a laminated assembly of one or more flexible materials with a first layer of the laminated assembly of a first thickness that establishes an open state of the fin array when the airflow is provided by the fan and a closed state of the fin array when the airflow is in a direction opposite to that provided by the fan, and the second layer of the laminated assembly of a second thickness to form the fins and provide rigidity to the fins.

While not illustrated in FIG. 7, the one or more flex limiter elements are integral to the frame in this example. The plurality of flex limiter elements are configured to limit flexure of the fin elements beyond a predetermined flexure in relation to the frame to stop backflow of air through the fin array. The flex limiter elements also provide structural support to the fin elements when the fin array is under load in a closed state.

Fans 714 comprise axial-flow fans with case mount frames for mounting to bulkhead assembly with fans and backflow preventers 700. Fans 714 further comprise motors. Some suitable motors for use with Fans 714 include AC, DC brushed or DC brushless motors.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A backflow stopper assembly, comprising:
a single fin array consisting of a single continuous monolithic sheet that:
comprises a plurality of fin elements arrayed in a radial arrangement to establish a pathway for airflow, each of the fin elements configured to move responsive to airflow impacting the fin element,
is configured to establish a default open state of the fin array, and
is configured to establish a closed state of the fin array when the airflow is in a direction opposite to that provided by a fan;
a frame configured to structurally support the fin array when coupled to the fan; and
one or more flex limiter elements coupled to the frame and configured to limit flexure of the fin elements beyond a predetermined flexure in relation to the frame to stop backflow of air through the fin array.

2. The backflow stopper assembly of claim 1 wherein:
the continuous monolithic sheet further comprises a plurality of flexural deformation elements associated with the fin elements; and
each of the flexural deformation elements is configured to move an attached fin element responsive to airflow impacting the attached fin element.

3. The backflow stopper assembly of claim 2 wherein:
the continuous monolithic sheet is formed from a laminated assembly of one or more flexible materials;
a first layer of the laminated assembly of a first thickness that is configured to establish the open state of the fin array responsive to the airflow being provided by the fan and the closed state of the fin array responsive to the airflow is in the direction opposite to that provided by the fan; and
a second layer of the laminated assembly of a second thickness to form the fin elements and provide rigidity to the fin elements.

4. The backflow stopper assembly of claim 2 wherein a flexural deformation element of the plurality of flexural deformation elements is individually configurable to flex and move an attached fin element a pre-determined amount in relation to the other flexural deformation elements and associated fin elements responsive to airflow.

5. The backflow stopper assembly of claim 2 wherein pairs of flexural deformation elements and associated fin elements are arrayed in a radial arrangement to establish a pathway for airflow configured such that each pair of the flexural deformation elements and fin elements close inwards towards each other along a common axis and open outward from each other along the axis.

6. The backflow stopper assembly of claim 2 wherein to move the attached fin elements, the flexural deformation elements are configured to flex the attached fin elements to a pre-determined angle of less than 90 degrees in relation to the fin array when the fin array is in an open airflow state, permitting the fin array to have less depth than a fin array having fin elements that open to 90 degrees in relation to the fin array.

7. The backflow stopper assembly of claim 1 wherein the continuous monolithic sheet is formed from a single continuous piece of material.

8. The backflow stopper assembly of claim 1 further comprising a fin array retainer comprising:
fin array retaining elements;
reference features for positioning the fin array retainer in relation to the fin array and the frame; and
features configured to couple the fin array retainer, the fin array, and the flex limiter elements to the frame.

9. The backflow stopper assembly of claim 1 further configured to have a depth of less than 20 millimeters.

10. A fan assembly comprising:
a fan; and
a backflow stopper assembly coupled to the fan, wherein the backflow stopper assembly comprises:
a single fin array consisting of a single continuous monolithic sheet that:
comprises a plurality of fin elements arrayed in a radial arrangement to establish a pathway for airflow, each of the fin elements configured to move responsive to airflow impacting the fin element,
is configured to establish a default open state of the fin array, and
is configured to establish a closed state of the fin array responsive to the airflow being in a direction opposite to that provided by the fan;
a frame configured to structurally support the fin array when coupled to the fan; and
one or more flex limiter elements coupled to the frame and configured to limit flexure of the fin elements beyond a predetermined flexure in relation to the frame to stop backflow of air through the fin array.

11. The fan assembly of claim 10 wherein the continuous monolithic sheet is flexible and of a predetermined thickness.

12. The fan assembly of claim 10 wherein:
the continuous monolithic sheet is formed from a laminated assembly of one or more flexible materials;
a first layer of the laminated assembly of a first thickness that is configured to establish the open state of the fin array responsive to the airflow being provided by the fan and the closed state of the fin array responsive to the airflow being in the direction opposite to that provided by the fan; and
a second layer of the laminated assembly of a second thickness is configured to form the fins and provide rigidity to the fins.

13. The fan assembly of claim 10 wherein to move the fin elements, flexural deformation elements are configured to flex the fin elements to a pre-determined angle of less than 90 degrees in relation to the fin array when the fin array is in an open airflow state, permitting the fin array to have less depth than a fin array having the fin elements open to 90 degrees in relation to the fin array.

14. The fan assembly of claim 10 wherein pairs of flexural deformation elements and associated fin elements are arrayed in a radial arrangement to establish a pathway for airflow configured such that each pair of the flexural deformation elements and fin elements close inwards towards each other along a common axis and open outward from each other along the axis.

15. The fan assembly of claim 10 wherein the one or more flex limiter elements are integral to the frame.

16. The fan assembly of claim 10 further comprising a fin array retainer comprising:
fin array retaining elements;
reference features for positioning the fin array retainer in relation to the fin array and the frame; and
features configured to couple the fin array retainer and fin array to the frame.

17. The fan assembly of claim 10 further configured to have a depth of less than 20 millimeters.

18. An electronics enclosure comprising:
an enclosure configured to encase and support electronic devices; and
one or more fan assemblies each with a corresponding backflow preventer, wherein each of the corresponding backflow preventers comprises:
a fin array consisting of a single continuous piece of material that:
comprises a plurality of fin elements arrayed in a radial arrangement to establish a pathway for airflow, each of the fin elements configured to move responsive to airflow impacting the fin element,
is configured to establish a default open state of the fin array, and
is configured to establish a closed state of the fin array responsive to the airflow being in a direction opposite to that provided by a fan of the one or more fan assemblies;
a frame configured to structurally support the fin array when coupled to the fan; and
one or more flex limiter elements coupled to the frame and configured to limit flexure of the fin elements beyond a predetermined flexure in relation to the frame to stop backflow of air through the fin array.

19. The electronics enclosure of claim 18 further comprising a plurality of sleds configured to encase and support a plurality of the electronic devices.

20. The electronics enclosure of claim 18 wherein the electronics devices comprise one or more from a group consisting of hard disk drives, solid state drives, and hybrid drives.

21. An electronics enclosure, comprising:
an enclosure configured to encase and support electronic devices; and
one or more fan assemblies each with a corresponding backflow preventer, wherein each of the corresponding backflow preventers comprises:
a fin array consisting of a single continuous piece of material that:
comprises a plurality of fin elements arrayed in a radial arrangement to establish a pathway for airflow, each of the fin elements configured to move responsive to airflow impacting the fin element,
is configured to establish a default open state of the fin array, and is configured to establish a closed state of the fin array responsive to the airflow being in a direction opposite to that provided by a fan of the one or more fan assemblies;

means for structurally supporting the fin array when coupled to the fan; and means for limiting flexure of the fin elements beyond a predetermined flexure in relation to the means for structurally supporting the fin array to stop backflow of air through the fin array.

* * * * *